(12) United States Patent
Wang et al.

(10) Patent No.: US 9,030,023 B2
(45) Date of Patent: May 12, 2015

(54) BOND PAD STACK FOR TRANSISTORS

(71) Applicant: Texas Instruments Incorporated, Dallas, TX (US)

(72) Inventors: Jing Wang, E'Er'Duo'Si Neimenggu (CN); Lin Lin, Chengdu (CN); Qiuling Jia, Chengdu (CN); Qi Yang, Chengdu (CN); Jianxin Liu, Chengdu (CN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/334,738

(22) Filed: Jul. 18, 2014

(65) Prior Publication Data

US 2015/0008511 A1 Jan. 8, 2015

Related U.S. Application Data

(62) Division of application No. 13/934,956, filed on Jul. 3, 2013, now Pat. No. 8,815,730.

(51) Int. Cl.
*H01L 23/00* (2006.01)
*H01L 23/522* (2006.01)
*H01L 29/78* (2006.01)
*H01L 23/495* (2006.01)

(52) U.S. Cl.
CPC .............. *H01L 24/05* (2013.01); *H01L 24/03* (2013.01); *H01L 2924/1306* (2013.01); *H01L 2924/10253* (2013.01); *H01L 2924/1033* (2013.01); *H01L 2924/13055* (2013.01); *H01L 2924/13062* (2013.01); *H01L 2924/13064* (2013.01); *H01L 2924/13091* (2013.01); *H01L 2924/14* (2013.01); *H01L 2224/04042* (2013.01); *H01L 2224/32245* (2013.01); *H01L 2224/48247* (2013.01); *H01L 2224/73265* (2013.01); *H01L 2224/94* (2013.01); *H01L 2224/40247* (2013.01); *H01L 23/522* (2013.01); *H01L 23/49524* (2013.01); *H01L 23/49562* (2013.01); *H01L 2924/1301* (2013.01); *H01L 2924/13034* (2013.01); *H01L 2924/1461* (2013.01); *H01L 29/7802* (2013.01); *H01L 2924/1305* (2013.01)

(58) Field of Classification Search
CPC .................. H01L 2924/14; H01L 2924/01079
USPC ............. 257/72, 618, 773; 438/164, 612, 617
See application file for complete search history.

(56) References Cited

U.S. PATENT DOCUMENTS

| | | | |
|---|---|---|---|
| 6,503,793 B1 * | 1/2003 | Chittipeddi et al. | 438/243 |
| 6,611,030 B1 * | 8/2003 | Lee | 257/369 |
| 2006/0214310 A1 | 9/2006 | Lo | |
| 2008/0017859 A1 | 1/2008 | Tai et al. | |
| 2009/0152100 A1 | 6/2009 | Dalal et al. | |

(Continued)

*Primary Examiner* — Phuc Dang
(74) *Attorney, Agent, or Firm* — Jacqueline J. Garner; Frank Cimino

(57) ABSTRACT

A method for forming bond pads on a semiconductor die includes forming a dielectric stack including a bottom and top dielectric layer having a contact hole therethrough over a bond pad. An outer edge of the bottom dielectric layer within the contact hole extends beyond an outer edge of the top dielectric layer to define a bond pad edge. A second metal layer on a first metal layer is deposited. A first photoresist layer is formed exclusively within the contact hole. The second metal layer is wet etched to recess the second metal layer from sidewalls of the bottom dielectric layer in the contact hole. A second photoresist layer is formed exclusively within the contact hole. The first metal layer is wet etched to recess the first metal layer from the top dielectric layer. The first metal layer extends over the bond pad edge onto the bottom dielectric layer.

4 Claims, 8 Drawing Sheets

(56) References Cited

U.S. PATENT DOCUMENTS

| | | |
|---|---|---|
| 2010/0184285 A1 | 7/2010 | Hua et al. |
| 2010/0263913 A1* | 10/2010 | Daubenspeck et al. ....... 174/250 |
| 2012/0007182 A1 | 1/2012 | Zhou et al. |
| 2013/0063527 A1* | 3/2013 | Ge et al. .......................... 347/63 |

* cited by examiner

BOND PAD STACK FOR TRANSISTORS

CROSS REFERENCE TO RELATED APPLICATIONS

This application is a divisional of U.S. Non Provisional patent application Ser. No. 13/934,956, filed Jul. 3, 2013, U.S. Pat. No. 8,815,730 the contents of which are herein incorporated by reference in its entirety.

FIELD

Disclosed embodiments relate generally to topside bond pad structures that connect to terminals of transistors, and methods for forming the same.

BACKGROUND

Aluminum is a common material for semiconductor device (semiconductor die) bond pad metallization since its introduction to the semiconductor world, including for discrete transistors and integrated circuits (IC). However, aluminum and high aluminum alloys quickly form a refractory ceramic oxide on the surface that requires special treatment to remove before achieving successful soldering thereto. This step is applied to most of the methods in making interconnections from the aluminum bond pad on the semiconductor die built on a semiconductor substrate, usually on single-crystal silicon.

The semiconductor die is packaged in a hermetically sealed case or a non-hermetic plastic capsule, with leads extending from bond pads on the chip to the leadframe. In an electroless nickel immersion gold (ENIG) Under Bump Metallization (UBM) process, the surface treatments starts with surface cleaning to remove any contaminant present on the aluminum bond pad surface, followed by an activation process to activate the bond pads for better nucleation for subsequent processing through the micro-etching of aluminum oxide.

A pre-plating process known as zincation is commonly used. During the zincation process, aluminum oxide is removed and is replaced with a thin layer of zinc metal. The zinc protects the aluminum from re-oxidation until it is ready to be plated. Once this process is performed, the aluminum coated zinc can then be electrolessly plated with nickel followed by immersion gold.

SUMMARY

Disclosed embodiments describe methods for forming bond pad stacks on a semiconductor die including at least one transistor having a terminal connected to a bond pad comprising a bond pad metal with a dielectric stack thereon having a contact hole on the bond pad. The dielectric stack includes a top dielectric layer on a bottom dielectric layer, wherein an outer edge of the bottom dielectric layer is within the contact hole and extends beyond an outer edge of the top dielectric layer to define an exposed bond pad area having a bond pad edge.

A second metal layer on a first metal layer is deposited on the bond pad metal. Wet metal etch processing using a first metal mask and a second metal mask having mask edges recessed from the top dielectric layer results in recessing the second metal layer from sidewalls of the first metal layer, recessing the first metal layer from the top dielectric layer, and the first metal layer extending over the bond pad edge onto the bottom dielectric layer.

BRIEF DESCRIPTION OF THE DRAWINGS

Reference will now be made to the accompanying drawings, which are not necessarily drawn to scale, wherein.

DETAILED DESCRIPTION

Figure 1:
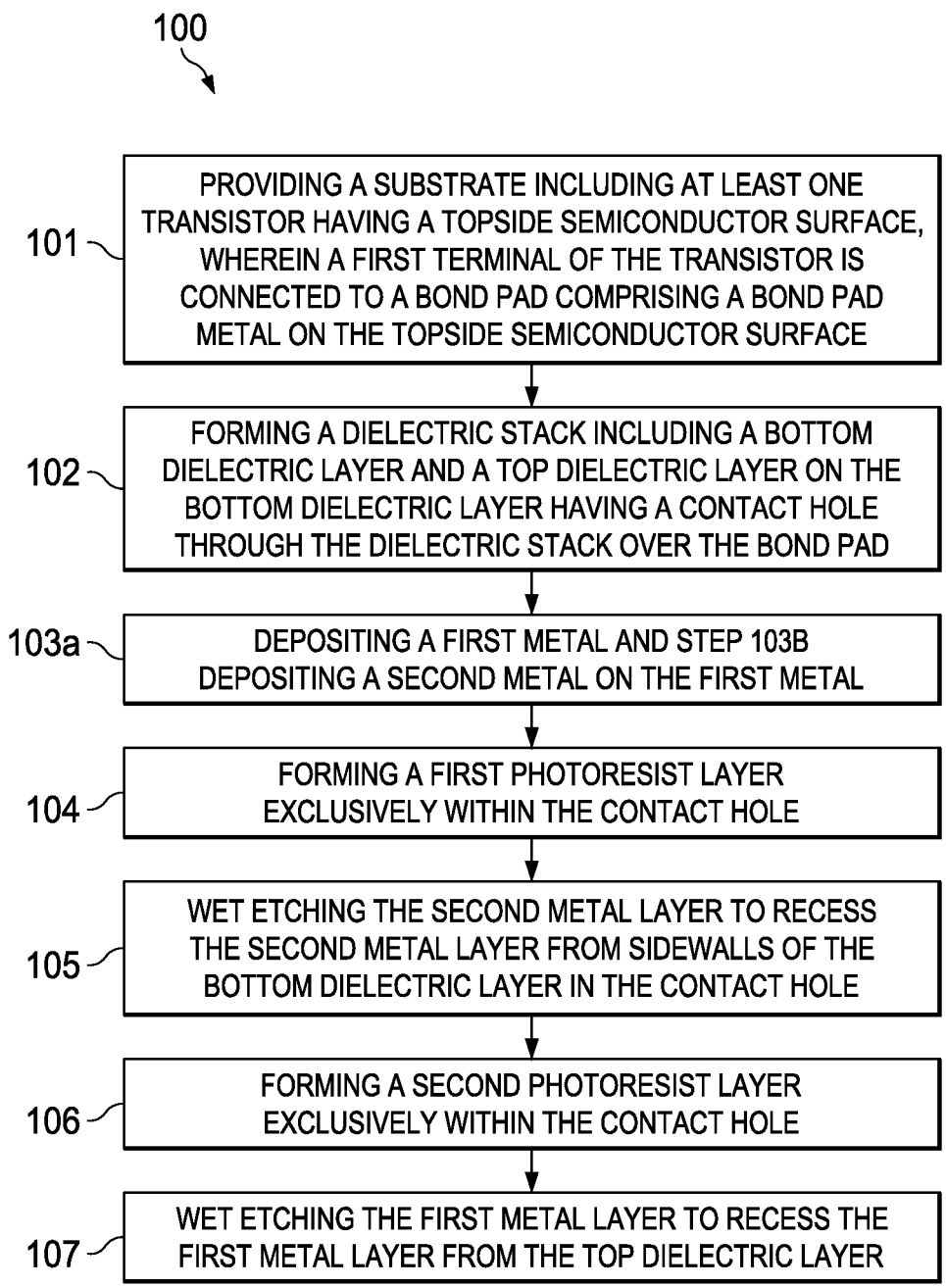
FIG. 1 is a flow chart that shows steps in an example method for forming for forming bond pad stacks on a semiconductor die, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 for forming bond pad stacks on a semiconductor die that is described together with FIGS. 2A-F which are cross-sectional diagrams showing processing progression for method 100 shown forming bond pad stacks on a semiconductor die comprising a power vertical metal oxide semiconductor (MOS) transistor, according to an example embodiment. Step 101 comprises providing a substrate including at least one transistor having a topside semiconductor surface, wherein a first terminal of the transistor is connected to a bond pad comprising a bond pad metal on the topside semiconductor surface. The bond pad material can comprise aluminum (Al) in one embodiment. However, the bond pad material can comprise other metals, such as copper, and can also comprise metal alloys.

The transistor can be a power MOS transistor having gate electrode on a gate dielectric on a topside semiconductor surface of the substrate. More generally, the power transistor can include bipolars including thyristors (pair of tightly coupled bipolar junction transistors also called silicon controlled rectifiers), field effect transistors (FETs) including junction gate field-effect transistors (JFETs), and metal-oxide-semiconductor field-effect transistors (MOSFETs) including double-diffused metal-oxide-semiconductor (DMOS), High-electron-mobility transistors (HEMTs, such as a GaN HEMT), as well as Insulated Gate Bipolar Transistors (IGBTs). Example substrates include silicon and GaN, and the topside semiconductor surface can be the same as the substrate material, or be different.

Step 102 comprises forming a dielectric stack including a bottom dielectric layer and a top dielectric layer on the bottom dielectric layer having a contact hole through the dielectric stack over the bond pad. In one embodiment the bottom dielectric layer is a dielectric stack including silicon nitride layer on a tetraethyl orthosilicate (TEOS) derived silicon oxide layer on a silicon oxynitride layer, and the second dielectric layer is a polyimide layer thicker than the bottom dielectric layer. An outer edge of the bottom dielectric layer within the contact hole extends beyond an outer edge of the top dielectric layer to define an exposed bond pad area having a bond pad edge.

Figure 2A:
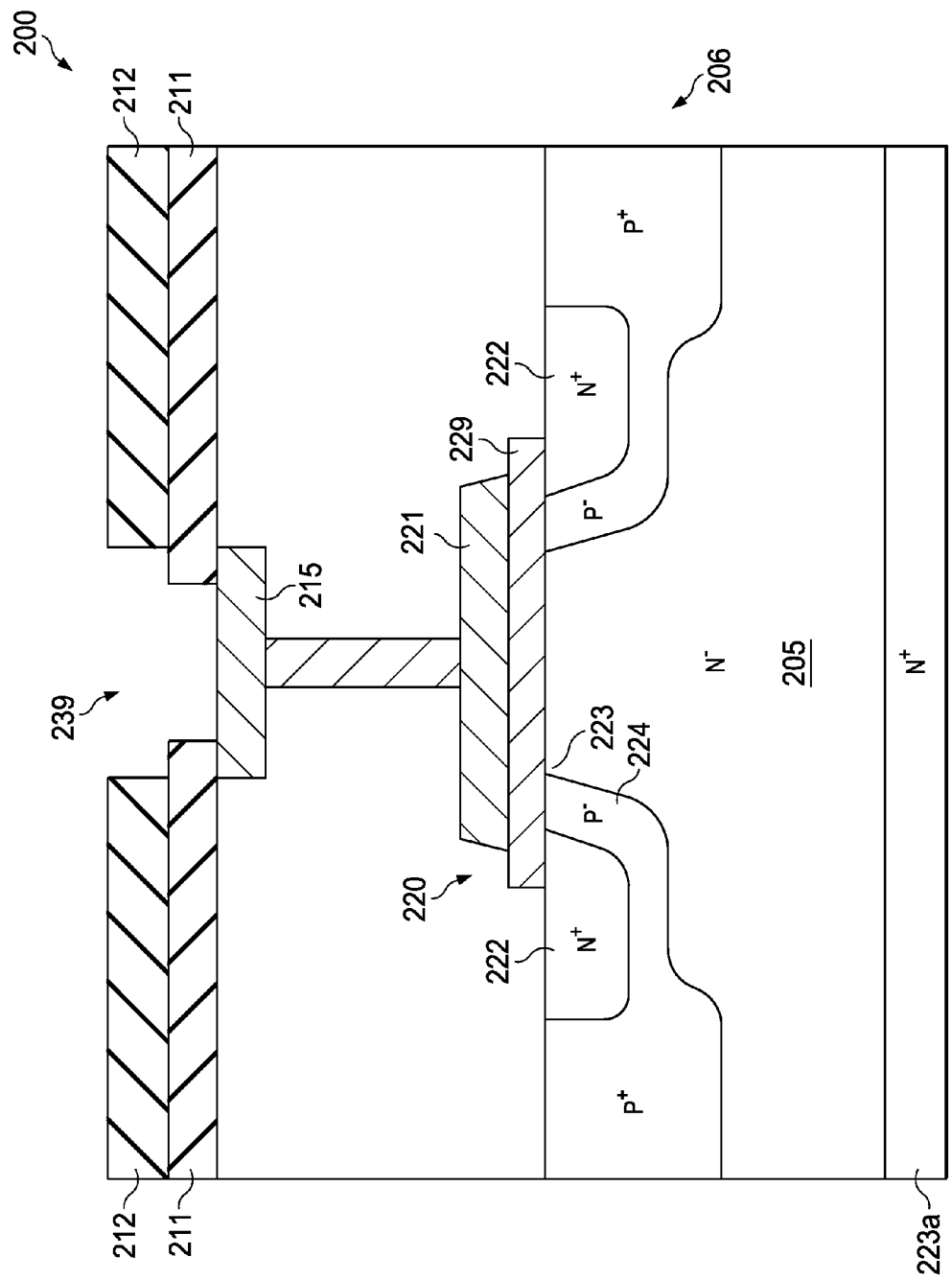
FIGS. 2A-F are cross-sectional diagrams showing processing progression for an example method of forming forming bond pad stacks on a semiconductor die, according to an example embodiment.

FIG. 2A is a cross sectional depiction of a semiconductor die 200 having a partially completed bond pad structure showing the substrate 205 with a topside semiconductor surface 206 having a dielectric stack thereon including a bottom dielectric layer 211 and a top dielectric layer 212 having a contact hole 239 through the dielectric stack over the bond pad 215.

The transistor is shown as an example n-channel vertical double diffused MOS (VDMOS) power transistor 220 that has a first terminal shown as its gate electrode 221 on a gate dielectric 229 connected to the bond pad 215. The drain of transistor 220 is shown as 222 and the source as 223, with a source contact 223a on the bottom side of the substrate 205. Transistor 220 includes p-body 224. Although not shown, the drain 222 is generally connected to a disclosed bond pad. An outer edge of the bottom dielectric layer 211 within the contact hole 239 can be seen to extend beyond an outer edge of the top dielectric layer 212 to result in the bond pad 215 having an exposed bond pad area having a bond pad edge.

Figure 2B:
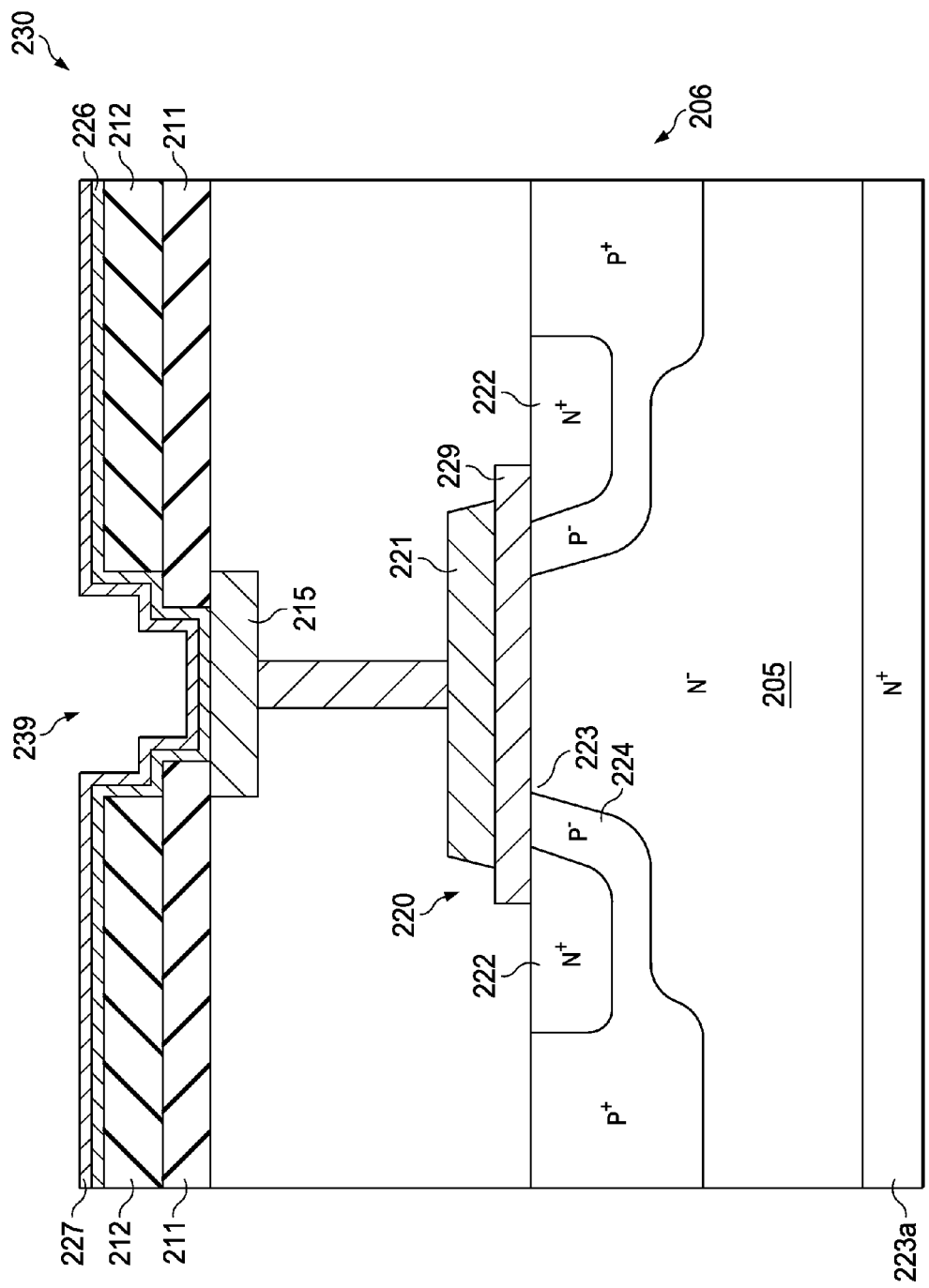

Step 103a comprises depositing a first metal layer, and step 103b comprises depositing a second metal layer on the first metal layer. The depositing of the first metal layer and depositing the second metal layer can both comprise sputtering. However, plating may also be used to deposit either of these metal layers. FIG. 2B is a cross sectional depiction of the semiconductor die 230 having the partially completed bond pad structure showing a second metal layer 227 on a first metal layer 226 including over the bond pad 215. The first metal layer 226 can comprise nickel (Ni). In the case the first metal layer 226 comprises Ni, the wet etchant for etching the first metal layer 226 can comprise nitric acid ($HNO_3$). The second metal layer 227 can comprise metals including silver and gold.

Figure 2C:
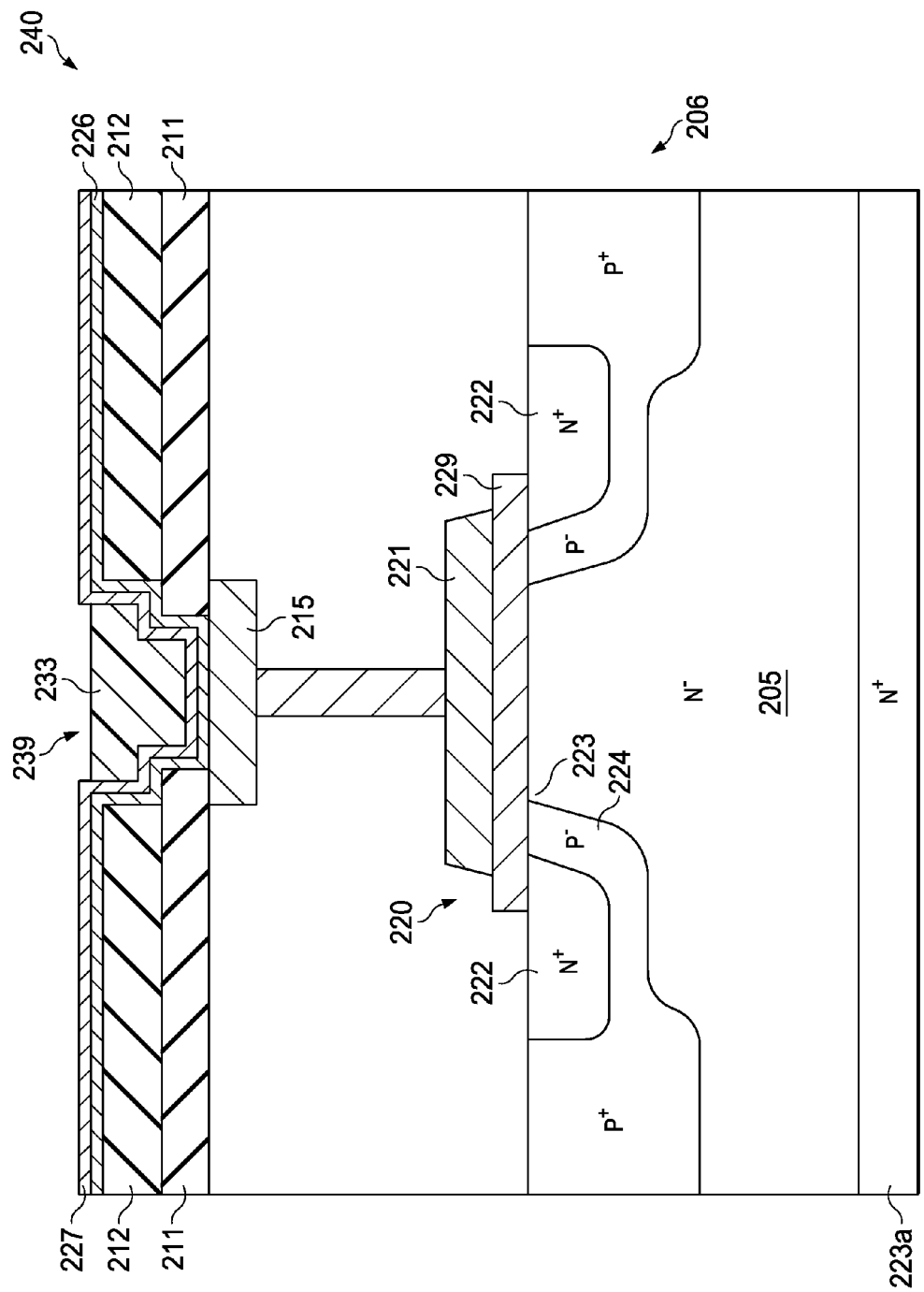

Step 104 comprises forming a first photoresist layer exclusively within the contact hole 239. The mask used for this step is referred to herein as metal mask 1. The metal mask 1 edge is on the bottom dielectric layer 211 but within the top dielectric layer 212, and thus exclusively within the contact hole 239. See also FIG. 3 described below which shows a depiction based a scanning electron microscope (SEM) of an example completed bond pad stack having metal mask edges added to show disclosed metal mask features and resulting metal layer edges. Photolithography using metal mask 1 forms a photoresist pattern with the first photoresist layer exclusively within the contact hole 239. FIG. 2C is a cross sectional depiction of semiconductor die 240 having the partially completed bond pad structure showing the first photoresist layer 233 being exclusively within the contact hole 239 over the bond pad 215.

Step 105 comprises wet etching the second metal layer 227 to recess the second metal layer 227 from sidewalls of the bottom dielectric layer 211 in the contact hole 239. The wet etchant for etching the second metal layer 227 in the case the second metal layer comprises Ag can comprise using a mixture of sulfuric acid ($H_2SO_4$) and phosphoric acid ($H_3PO_4$).

Figure 2D:
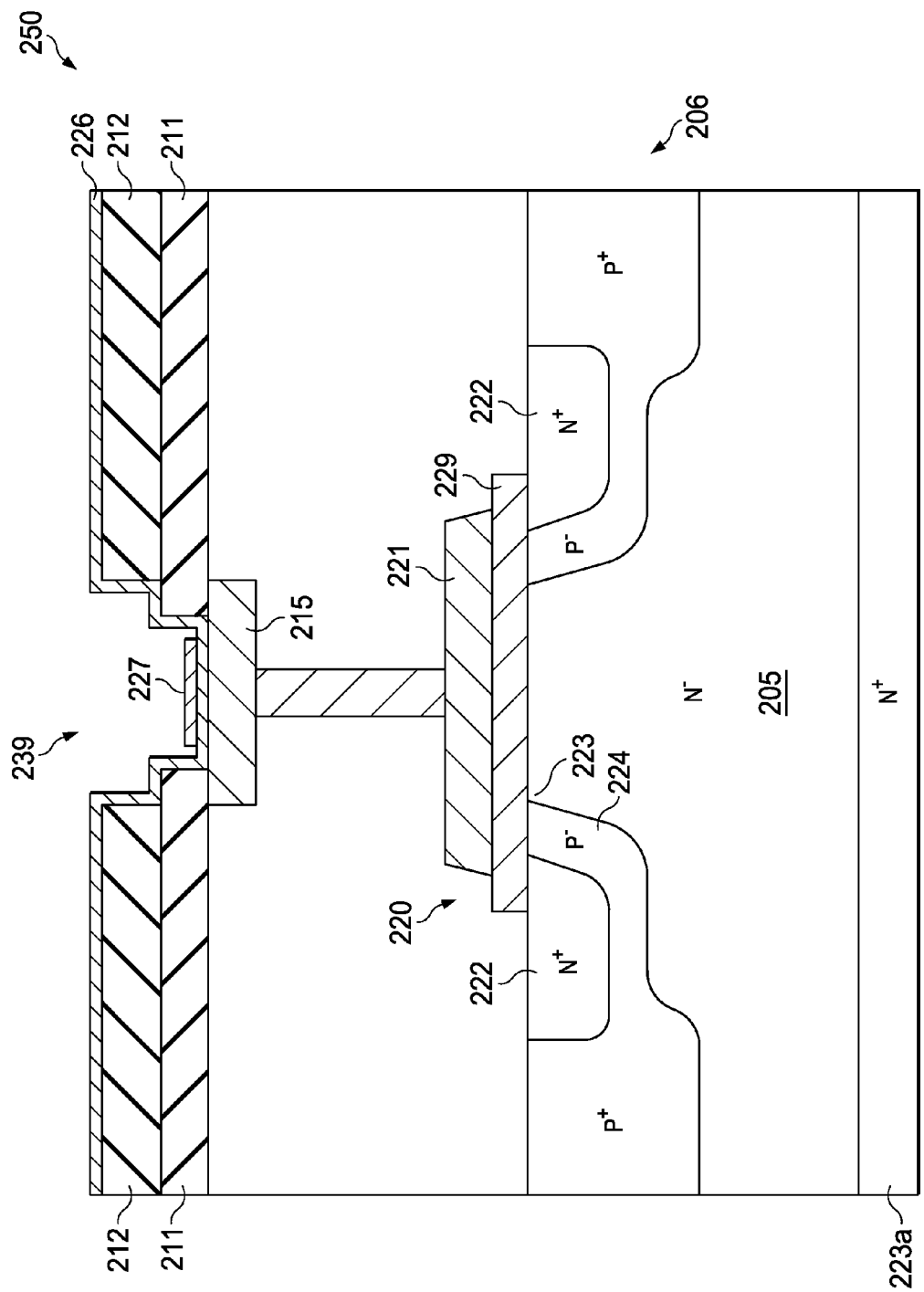
Figure 2E:
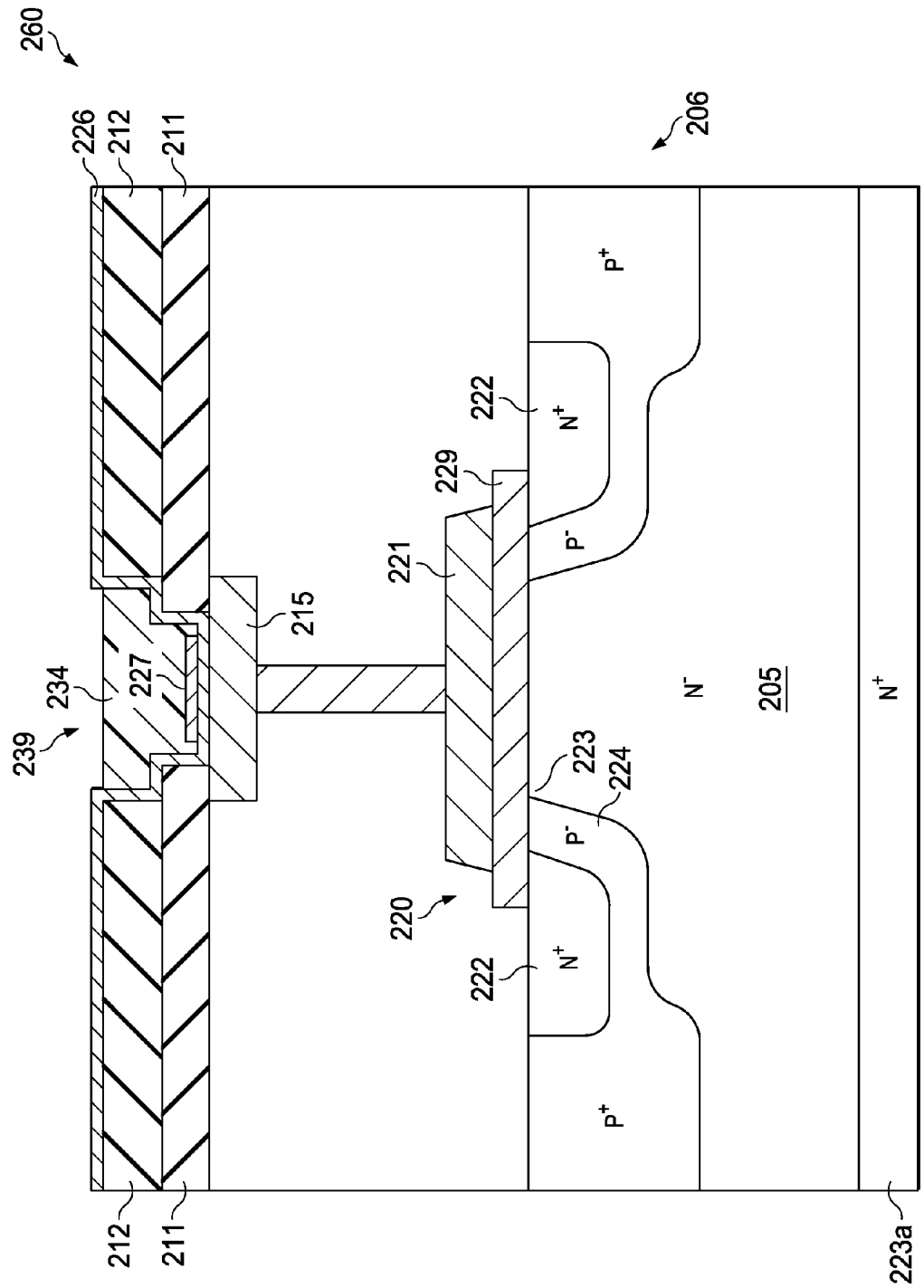

FIG. 2D is a cross sectional depiction of the semiconductor die 250 showing the partially completed bond pad structure after wet etching of the second metal layer 227 to recess the second metal layer 227 from sidewalls of the bottom dielectric layer 211 in the contact hole 239. Step 106 comprises forming a second photoresist layer exclusively within the contact hole. The mask used for this step is referred to herein as metal mask 2. The metal mask 2 edge is on the bottom dielectric layer 211 but within the top dielectric layer 212, and is thus exclusively within the contact hole 239. See also FIG. 3 described below which shows a depiction based on a SEM of an example completed bond pad stack having metal mask edges added to show disclosed metal mask features and resulting metal layer edges. Photolithography using metal mask 2 forms a photoresist pattern with the second photoresist layer exclusively within the contact hole 239. FIG. 2E is a cross sectional depiction of the semiconductor die 260 having the partially completed bond pad structure showing the second photoresist layer 234 exclusively within the contact hole 239.

Figure 2F:
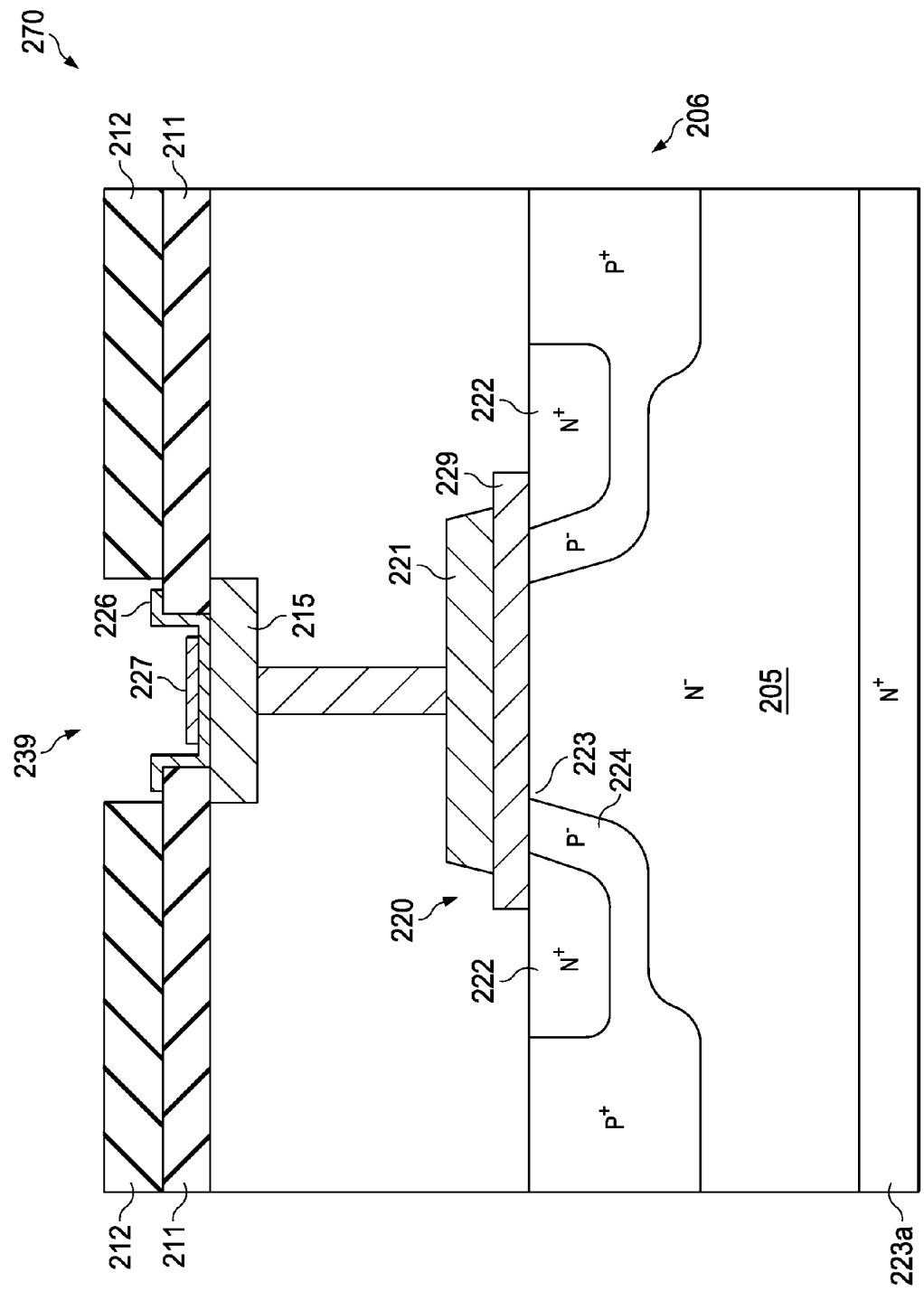

Step 107 comprises wet etching the first metal layer 226 to recess the first metal layer 226 from the top dielectric layer 212, wherein the first metal layer 226 extends over the bond pad edge onto the bottom dielectric layer 211. FIG. 2F is a cross sectional depiction of the semiconductor die 270 having the completed bond pad structure showing the first metal layer 226 recessed from the top dielectric layer 212 and extending over the bond pad edge of the bond pad 215 onto the bottom dielectric layer 211, and the second metal layer 227 on and within the area of the first metal layer 226.

The process generally continues with adding backside metal, and then continues with dicing and packaging which generally follow. In one embodiment, the packaging includes solder mediated stacking of two (2) NMOS power vertical power transistors (such as each being VDMOS power transistor 220 in FIG. 2A) with a first vertical power transistor source side down on a leadframe that is on a printed circuit board (PCB), a first metal clip on the drain side of the first vertical power transistor connected to a lead of the leadframe, a second vertical power transistor drain side down on the first metal clip, and a second metal clip on the source side of the second vertical power transistor connected to a lead of the leadframe. Bond wire connection can be made from disclosed bond pads connected to the respective gate electrodes of the first vertical power transistor and second vertical power transistor to leads of the leadframe.

Figure 3:
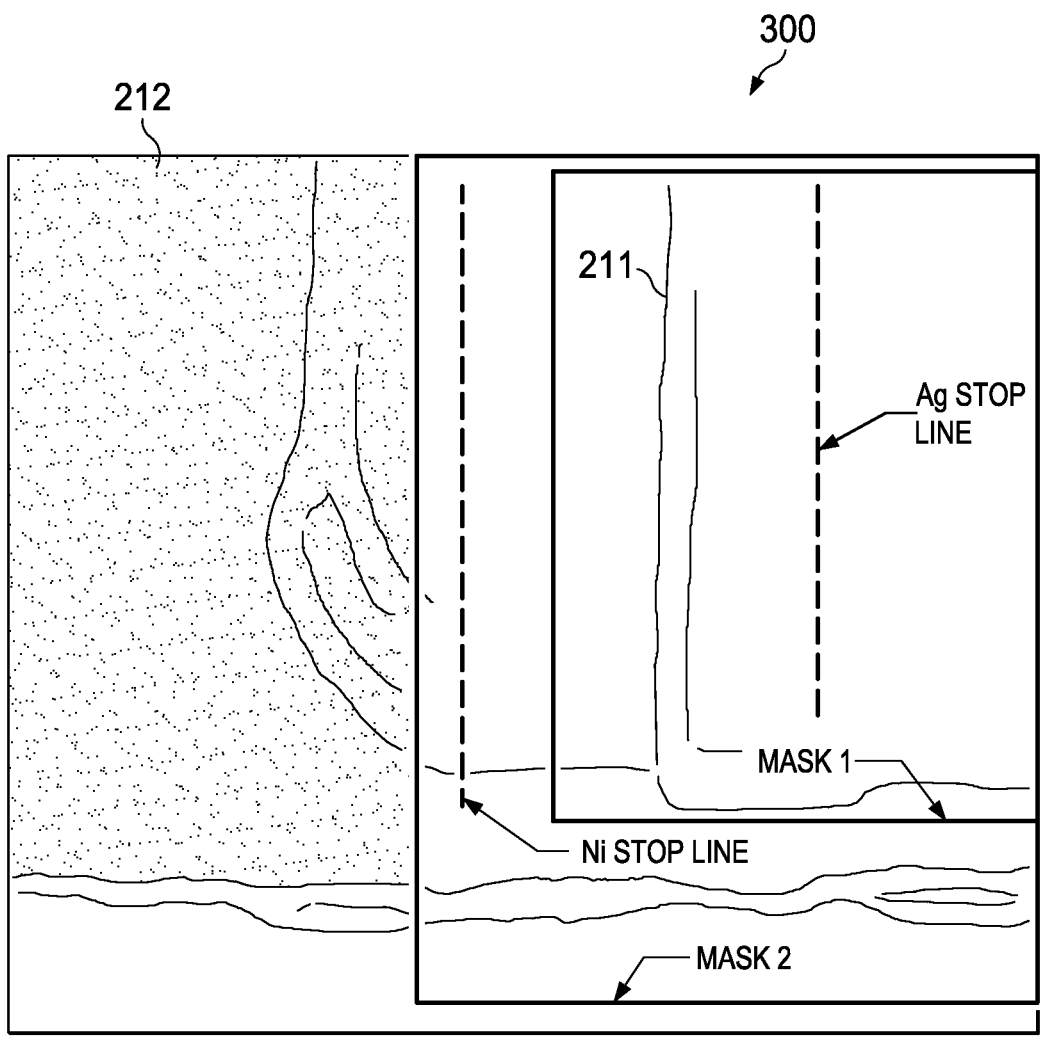
FIG. 3 is a depiction based a scanning electron microscope (SEM) of an example completed bond pad stack having metal mask edges for metal mask 1 and metal mask 2 added to show disclosed metal mask features and resulting post-etch metal layer edges.

FIG. 3 is a depiction 300 based a SEM of an example completed bond pad stack having metal mask edges added to show disclosed metal mask features and resulting metal layer edges. For this description, the second metal layer is referred as Ag, and the first metal layer as Ni. The bottom dielectric layer 211 and top dielectric layer 212 are shown. The second metal edge shown as a broken line with the title "Ag stop line" is shown recessed from the edge of the bottom dielectric layer 211 a distance that is determined by the metal mask 1 pattern edge shown on the bottom dielectric layer 211 together with lateral etching of the Ag layer from the wet etch process. Surprisingly, different wet etch times resulted in essentially the same Ag stop line position, until the etching time exceeded about 3 minutes which resulted in a rapid increase of lateral etch rate leading to the Ag layer being etched to the center of the bond pad, which is an unacceptable result. To move the Ag stop line to left or right, it was found the metal mask 1 edges can be moved.

Regarding metal mask 2 for etching the Ni layer, the mask pattern has been found to determine the Ni layer resulting profile, so that the resulting profile where the resulting Ni layer edge stops can be controlled by increasing or reducing the wet etching time. However, the gap shown between the edge of metal mask 1 and the top dielectric layer 212 has been found to have a significant influence to the resulting Ni profile. The more space there is, the higher the lateral etching rate. Accordingly, based on the pattern size, it has been found to be possible to set difference spaces to get a higher or lower etch rate, enabling better process control especially on smaller patterns.

Based on the test performed disclosed embodiments have been found to help avoid a defect known as step plating which can occur in conventional metal plating processes over Al bond pads where the Ni does not extend over all bond pad metal edges. Missing Ni along any of the bond pad edge generally results in wafer scrap due to exposed Al on the bond pad. A challenge in conventional metal plating processes is the difficulty in controlling the Ni on the Al bond pads with good uniformity, as different Ni profiles at different sidewall locations even on one bond pad has been found to result. Metal sputter has been found to provide better uniformity control and essentially the same Ni profile for each die after wet etching.

Regarding bond pad size, due to mask tolerances to form disclosed recesses with the contact hole over the bond pad and wet etching, the minimum bond pad size actually fabricated was about 1 mm by 0.7 mm. However, disclosed methods are suitable for bond pad sizes down to at least to about 0.5 mm by 0.5 mm.

Disclosed embodiments can be used to form semiconductor die including discrete devices such as power transistors or ICs that may integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A transistor, comprising:
a substrate having a topside semiconductor surface, wherein a first terminal of said transistor is connected to a bond pad comprising a bond pad metal on said topside semiconductor surface;
a dielectric stack including a bottom dielectric layer and a top dielectric layer having a contact hole through said dielectric stack over said bond pad, wherein an outer edge of said bottom dielectric layer within said contact hole extends beyond an outer edge of said top dielectric layer to define an exposed bond pad area having a bond pad edge, and
a metal stack in said contact hole including over said exposed bond pad area, wherein said metal stack comprises:
a first metal layer;
a second metal layer on said first metal layer,
wherein in said contact hole said second metal layer is recessed from sidewalls of said bottom dielectric layer, and
wherein in said contact hole said first metal layer is recessed from said top dielectric layer and said first metal layer extends over said bond pad edge onto said bottom dielectric layer.

2. The transistor of claim 1, wherein said bond pad metal comprises aluminum and said first metal layer comprises nickel.

3. The transistor of claim 2, wherein said second metal layer comprises silver.

4. The transistor of claim 1, wherein said transistor comprises a vertical metal oxide semiconductor (MOS) power transistor.

* * * * *